United States Patent
Osvaldella

(10) Patent No.: US 7,106,119 B2
(45) Date of Patent: Sep. 12, 2006

(54) CIRCUIT FOR THE TEMPORARY INTERRUPTION OF A SYNC SIGNAL

(75) Inventor: Mauro Osvaldella, Laspezia (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/857,598

(22) Filed: May 27, 2004

(65) Prior Publication Data

US 2005/0017779 A1 Jan. 27, 2005

(30) Foreign Application Priority Data

May 30, 2003 (IT) .......................... MI2003A1087

(51) Int. Cl.
*G06F 1/04* (2006.01)
(52) U.S. Cl. ...................... 327/294; 327/299
(58) Field of Classification Search ................ None
See application file for complete search history.

(56) References Cited

U.S. PATENT DOCUMENTS

| | | | |
|---|---|---|---|
| 4,544,963 A * | 10/1985 | Jacoby et al. ............... 360/40 |
| 5,396,337 A * | 3/1995 | Choi ........................... 386/46 |
| 5,623,223 A * | 4/1997 | Pasqualini .................. 327/298 |
| 5,668,982 A * | 9/1997 | Davis .......................... 713/600 |
| 5,789,953 A * | 8/1998 | Au et al. ..................... 327/116 |
| 5,900,757 A * | 5/1999 | Aggarwal et al. ........... 327/198 |
| 5,926,044 A * | 7/1999 | Niimura ....................... 327/99 |
| 6,055,619 A * | 4/2000 | North et al. ................. 712/36 |
| 2002/0186787 A1* | 12/2002 | Fischer ....................... 375/316 |

* cited by examiner

Primary Examiner—Timothy P. Callahan
Assistant Examiner—Cassandra Cox
(74) Attorney, Agent, or Firm—Lisa K. Jorgenson; E. Russell Tarleton; Seed IP Law Group PLLC

(57) ABSTRACT

A stop and release circuit of a sync signal, to temporarily suspend or interrupt the sync signal, the input sync signal having a plurality of leading edges and a plurality of trailing edges, the circuit including a first divider that receives the input sync signal and supplies a first signal made up of the sync signal divided by two starting from a leading edge, a second divider that receives the inverse input sync signal and supplies a second signal made up of the sync signal divided by two starting from a trailing edge, an exclusive OR circuit that receives the first signal and the second signal and that supplies an output sync signal, a stop circuit for the first divider and the second divider, and an asynchronous command signal generated by the stop circuit for the temporary interruption of the output sync signal.

20 Claims, 3 Drawing Sheets

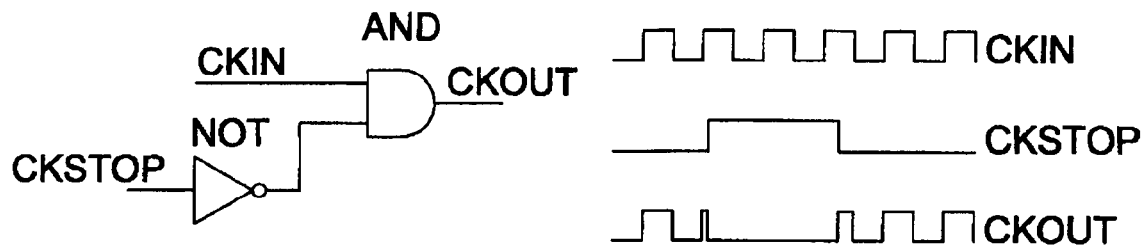
FIG. 1A
(Prior Art)
FIG. 1B
(Prior Art)
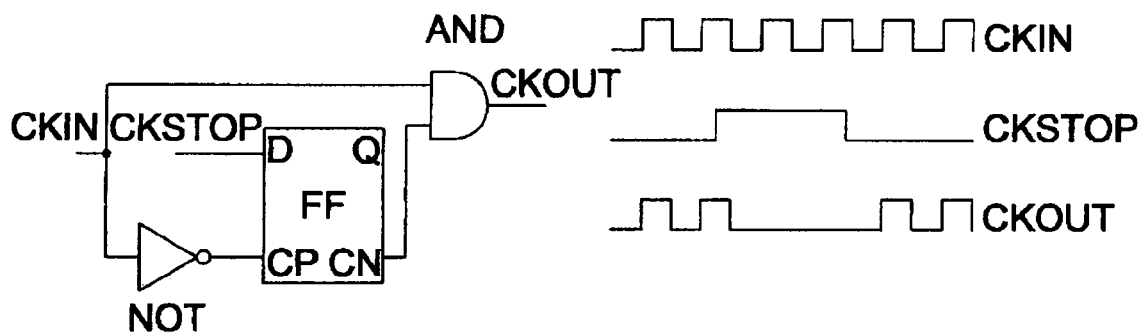
FIG. 2A
(Prior Art)
FIG. 2B
(Prior Art)
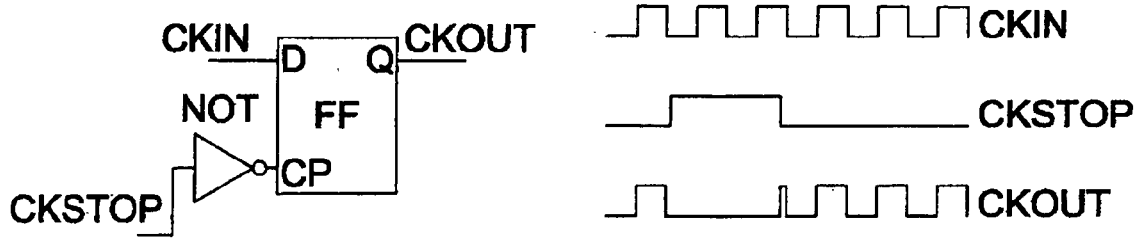
FIG. 3A
(Prior Art)
FIG. 3B
(Prior Art)

CIRCUIT FOR THE TEMPORARY INTERRUPTION OF A SYNC SIGNAL

BACKGROUND OF THE INVENTION

1. Field of the Invention

The present invention pertains to a stop and release circuit for a sync signal and, more particularly, to a circuit capable of temporarily suspending or interrupting the sync signal.

2. Description of the Related Art

Sync signals are used in every digital circuit for coordinating the events. However it is often necessary to stop the sync signal, for example in the case of inactivity of a circuit, and to make it start up again as soon as it is needed.

However the action of temporarily interrupting a sync signal, in particular asynchronously, can cause glitches, that is pulses with a shorter duration than that of a half-wave of the sync signal. These pulses can create considerable disturbance to the circuits to which they are applied and also to those nearby.

BRIEF SUMMARY OF THE INVENTION

In view of the state of the technique described, the disclosed embodiments of the present invention provide a circuit for the temporary interruption of a sync signal that eliminates the presence of glitches.

In accordance with one embodiment of the present invention, a circuit for the temporary interruption of an input sync signal is provided that has a plurality of leading edges and a plurality of trailing edges, including a first divider that receives the input sync signal and supplies a first signal made up of the sync signal divided by two starting from a leading edge; a second divider that receives the inverse input sync signal and supplies a second signal made up of the sync signal divided by two starting from a trailing edge; an exclusive OR circuit that receives the first signal and the second signal and supplies an output sync signal; a stopping circuit for the first divider and the second divider; an asynchronous command signal of the stopping circuit for the temporary interruption of the output sync signal.

In accordance with another embodiment of the invention, a circuit for the temporary interruption of an input sync signal is provided that includes a first flip flop having a first input for receiving the input sync signal and an output; a second flip flop having a first input for receiving the input sync signal and an output; an exclusive OR circuit having first and second inputs coupled to the outputs of the first and second flip flops, respectively and generating an output sync signal; and a control circuit having first and second inputs coupled to the outputs of the first and second flip flops, respectively, third and fourth inputs coupled to second outputs of the first and second flip flops, respectively, a control input for receiving a stop signal, and first and second outputs coupled to inputs of the first and second flip flops.

In accordance with another embodiment of the invention, a circuit for the temporary interruption of an input sync signal is provided that includes a first flip flop having a first input for receiving a control signal and a second input for receiving the input sync signal, and a first output; a second flip flop having a first input for receiving a second control signal and a second input for receiving an inverse of the input sync signal, and a first output; an exclusive OR circuit having a first input coupled to the first output of the first flip flop and a second input coupled to the first output of the second flip flop; and a control circuit having a first input coupled to the first output of the first flip flop, a second input coupled to an inverting output of the second flip flop, a third input coupled to the first output of the second flip flop, and a fourth input configured to receive a stop signal.

In accordance with another embodiment of the invention, a method for the temporary interruption of an input sync signal is provided that includes supplying an input sync signal to a first flip flop and an inverse of the input sync signal to a second flip flop; generating an output from the first flip flop that is made up of the input sync signal divided by two starting from a leading edge, and generating from the second flip flop an output signal that is made up of the input sync signal inverted divided by two starting from a trailing edge; and supplying a stop signal to a control circuit that in turn sends stop signals to the first and second flip flops that stops their outputs at the state in which they were previously.

BRIEF DESCRIPTION OF THE SEVERAL VIEWS OF THE DRAWINGS

The characteristics and advantages of the present invention will be evident from the following detailed description of an embodiment thereof, illustrated as non-limiting example in the enclosed drawings, in which:

FIG. 1A shows a circuit for the temporary interruption of a sync signal in accordance with the known art, and FIG. 1B shows the characteristic digital signals of the circuit of FIG. 1A;

FIG. 2A shows another circuit for the temporary interruption of a sync signal in accordance with the known art, and FIG. 2B shows the characteristic digital signals of the circuit of FIG. 2A;

FIG. 3A shows yet another circuit for the temporary interruption of a sync signal in accordance with the known art, and FIG. 3B shows the characteristic digital signals of the circuit of FIG. 3A;

DETAILED DESCRIPTION OF THE INVENTION

FIGS. 1A through 3B will now be described as illustrations of the known art, and the disadvantages thereof discussed in the context of these figures.

FIG. 1A shows an AND circuit with an input sync signal CKIN applied to an input, and at the other input the inverse signal CKSTOP from the inverting circuit NOT, and which supplies at the output the output sync signal CKOUT. FIG. 1B shows the characteristic digital signals CKIN, CKSTOP, and CKOUT of the circuit of FIG. 1A.

FIG. 2A shows an AND circuit with an input sync signal CKIN applied to an input, and at the other input the inverse output signal QN of a flip flop FF of the D type, and which supplies at the output the output sync signal CKOUT. At the input D of the flip flop FF, the signal CKSTOP is applied; and at the synchronism input CP, the inverse input sync signal CKIN from the inverting circuit NOT is applied. FIG. 2B shows the characteristic digital signals CKIN, CKSTOP, and CKOUT of the circuit of FIG. 2A.

FIG. 3A shows a flip flop circuit FF of the D type with an input sync signal CKIN applied to its input D, and which supplies to its non-inverse output Q the output sync signal CKOUT. At the sync input CP of the flip flop circuit FF, the inverse input sync signal CKIN is applied by the inverting circuit NOT. FIG. 3B shows the characteristic digital signals CKIN, CKSTOP, and CKOUT of the circuit of FIG. 3A.

The action of temporarily interrupting a sync signal, in particular in asynchronous manner, can be carried out as done in the previously described circuits. In the case of FIG. 1A, if the signal is asynchronous, narrow pulses can be generated at the output of the circuit AND, that is pulses of shorter duration than a half-wave of the input sync signal, both before and after the stop signal CKSTOP.

In the case of FIG. 2A, to avoid the narrow pulses mentioned above, the stop signal CKSTOP has been synchronized with the same sync signal CKIN, but this implies that it is necessary to wait for an edge before having the sync signal CKIN stopped, and in addition, if the sync signal CKIN is absent, there is never the certainty of having it in a stable state.

In the case of FIG. 3A a latch (flip flop FF) is used instead of the circuit AND to stop the sync signal CKIN. In this case the sync signal CKIN is stopped by the asynchronous control signal CKSTOP without narrow pulses, but when the latch FF becomes transparent in a non-synchronous manner with the clock, narrow pulses can be generated.

Figure 4A:
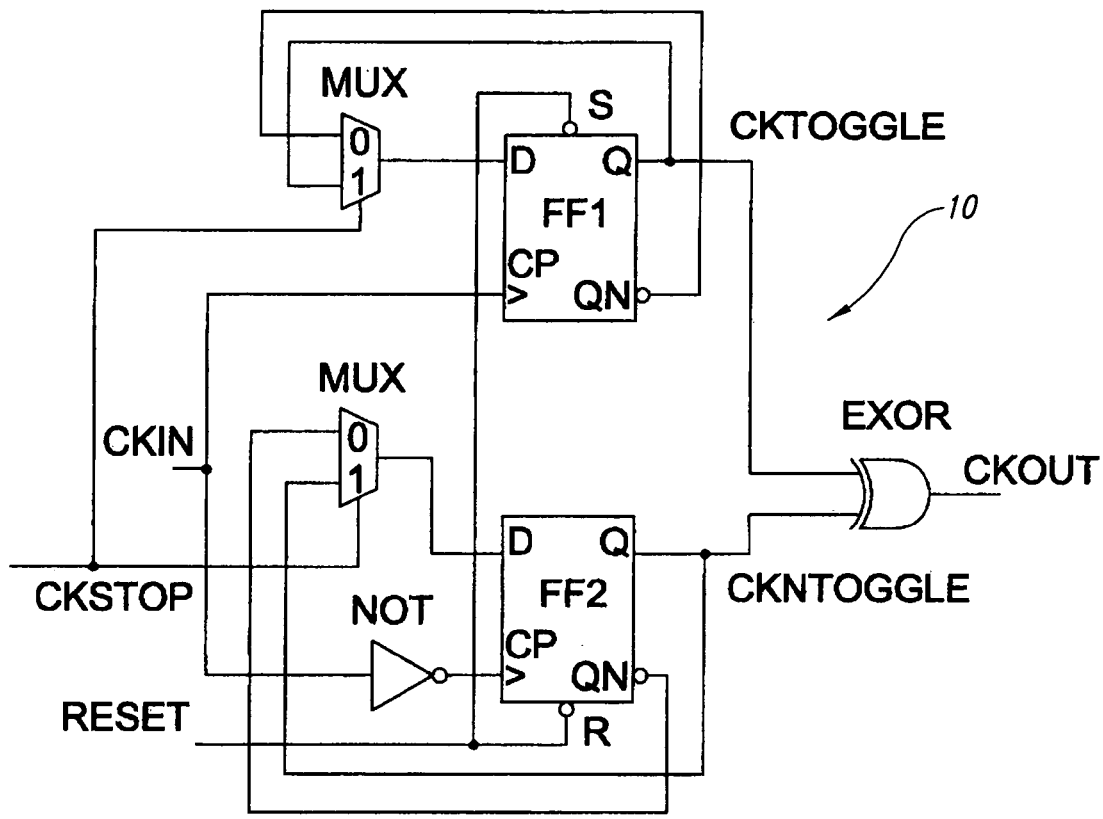
FIG. 4A shows a circuit for the temporary interruption of a sync signal in accordance with the present invention.

FIG. 4A shows a circuit for the temporary interruption of a sync signal in accordance with the present invention. The circuit 10 comprises a flip flop FF1 of the D type to which the input sync signal CKIN is applied at its sync input CP, the output signal of a multiplexer MUX1 is applied at its input D, its non-inverse output Q is applied to an input of a circuit EXOR and to the input 1 of the multiplexer MUX1, and its inverse output QN is applied to the input 0 of the multiplexer MUX1.

In addition, the circuit 10 comprises a flip flop FF2 of the D type at its sync input CP, of which the input sync signal CKIN inverted by the inverting circuit NOT is applied, while at its input D the output signal of a multiplexer MUX2 is applied, its non-inverted output Q is applied to another input of the circuit EXOR and to the input 1 of the multiplexer MUX2, and its inverse output QN is applied to the input 0 of the multiplexer MUX2.

The stop signal CKSTOP is applied to the control inputs of the multiplexers MUX1 and MUX2.

The output of the circuit EXOR supplies the output sync signal CKOUT. The non-inverse output Q of the flip flop FF1 supplies the signal CKTOGGLE, and the non-inverse output Q of the flip flop FF2 supplies the signal CKNTOGGLE.

A signal RESET is applied to the input R of the flip flop FF2 and to the input S of the flip flop FF1.

Figure 4B:
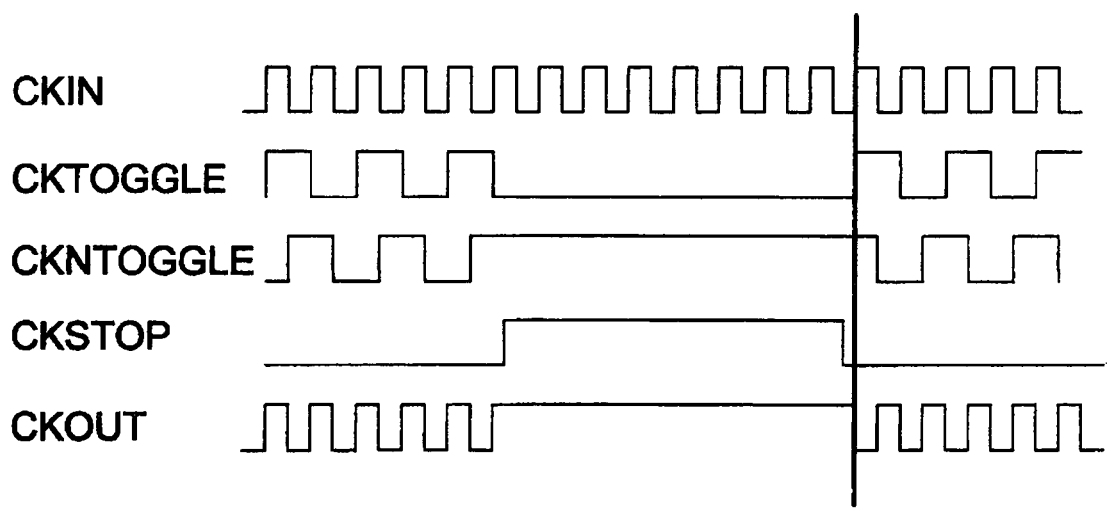
FIG. 4B shows the characteristic digital signals of the circuit of FIG. 4A.

FIG. 4B shows the characteristic digital signals CKIN, CKSTOP, and CKOUT, CKTOGGLE, and CKNTOGGLE of the circuit of FIG. 4A.

Figure 5A:
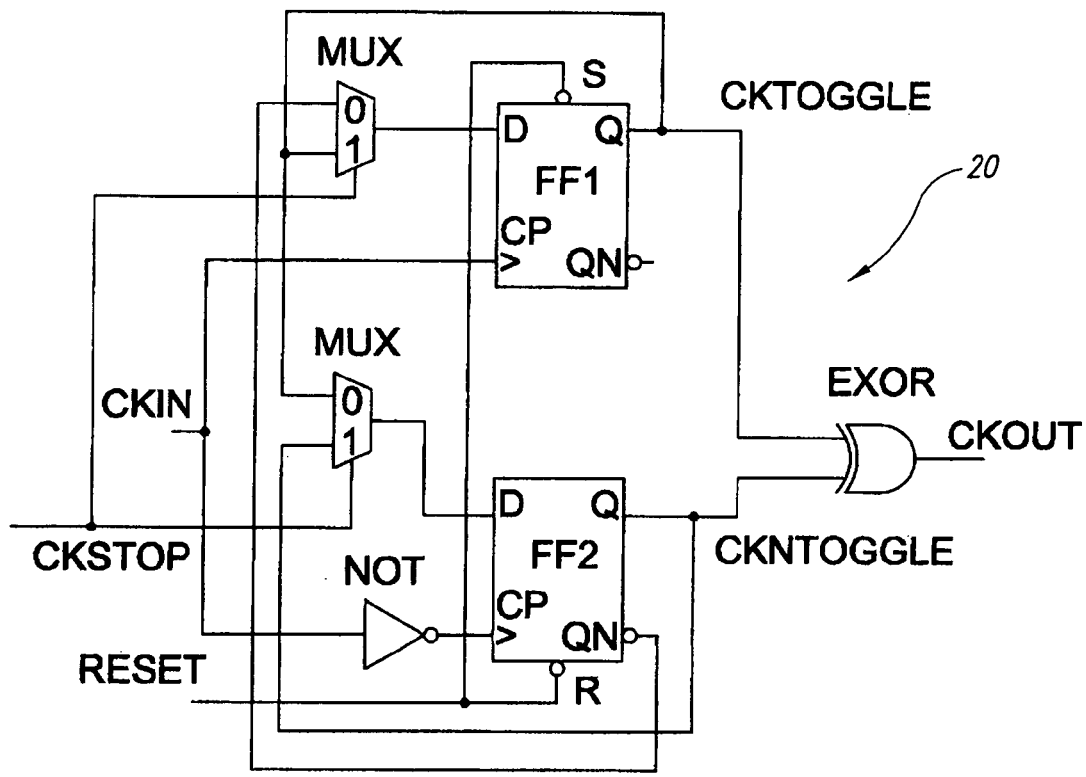
FIG. 5A shows another circuit for the temporary interruption of a sync signal in accordance with the present invention.

FIG. 5A shows another circuit 20 for the temporary interruption of a sync signal in accordance with the present invention. The circuit 20 includes a flip flop FF1 of the D type to which at its sync input CP the input sync signal CKIN is applied. At its input D, the output signal of a multiplexer MUX1 is applied, and its non-inverse output Q is applied to an input of a circuit EXOR, to the input 1 of the multiplexer MUX1, and to the input 0 of a multiplexer MUX2.

In addition, the circuit 20 includes a flip flop FF2 of the D type. At its sync input CP is applied the input sync signal CKIN inverted by the inverting circuit NOT. To its input D is applied the output signal of a multiplexer MUX2, its non-inverse output Q is applied to another input of the circuit EXOR and to the input 1 of the multiplexer MUX2, and its inverse output QN is applied to the input 0 of the multiplexer MUX1.

The stop signal CKSTOP is applied to the control inputs of the multiplexers MUX1 and MUX2.

The output of the circuit EXOR supplies the output sync signal CKOUT. The non-inverse output Q of the flip flop FF1 supplies the signal CKTOGGLE, and the non-inverse output Q of the flip flop FF2 supplies the signal CKNTOGGLE.

A signal RESET is applied to the input R of the flip flop FF2 and to the input S of the flip flop FF1.

Figure 5B:
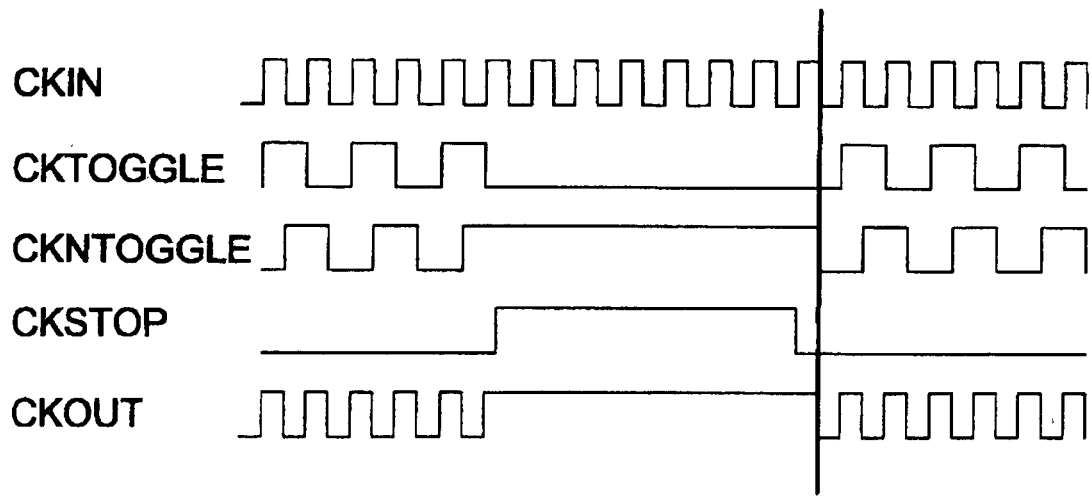
FIG. 5B shows the characteristic digital signals of the circuit of FIG. 5A.

FIG. 5B shows the characteristic digital signals CKIN, CKSTOP, and CKOUT, CKTOGGLE, and CKNTOGGLE of the circuit of FIG. 5A.

In the case of FIG. 4A, when the signal CKSTOP is activated on the low phase of CKIN and deactivates on the high phase (or vice versa) the phase of the output sync signal CKOUT is inverted in relation to the input sync signal CKIN. This occurs because the signals CKTOGGLE and CKNTOGGLE change their phase relation. When instead the signal CKSTOP is activated and deactivated on equal phases, there is no inversion of the signal CKOUT.

While in the case of FIG. 5A, the signals CKTOGGLE and CKNTOGGLE never change their phase relation and therefore there cannot be inversion of the signal CKOUT. When the signal CKSTOP is low, the flip-flop FF1 changes state at every leading edge of the CKIN, generating the signal CKTOGGLE. The commutation has effect because, as it can be seen from FIG. 5B, when the leading edge of CKIN arrives, the data in input to FF1 is of an opposite value to its output. Similarly, the signal CKNTOGGLE is generated by FF2, which commutates on the trailing edge of CKIN. It can be easily verified from FIG. 5B that at the output of the exclusive OR, a signal CKOUT equal to CKIN is obtained.

When the control signal CKSTOP becomes high, the two flip flops FF1 and FF2 no longer commutate because the data at their input is equal to their output. Consequently, the signal CKOUT remains in a stable state.

When the control signal returns low, the two flip flops FF1 and FF2 return to commutate again, generating CKOUT similar to CKIN.

In view of the method by which CKOUT is generated, there cannot be glitches.

Both in the case of FIG. 4A and in the case of FIG. 5A the flip flops FF1 and FF2 the behavior is like that of the dividers for two of the input sync signals CKIN. In particular, the flip flop FF1 supplies the signal CKTOGGLE which is made up of the input sync signal CKIN divided by two starting from a leading edge, and the flip flop FF2 supplies the signal CKNTOGGLE which is made up of the input sync signal CKIN divided by two starting from a trailing edge.

The stop circuit of the sync signal is made up of the multiplexers MUX1 and MUX2 commanded by the stop signal CKSTOP. Following the change of state of the signal CKSTOP, the multiplexers MUX1 and MUX2 send suitable signals to the flip flops FF1 and FF2, stopping their outputs at the state in which they were previously, and therefore stopping the signal CKOUT at the output of the circuit EXOR.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

The invention claimed is:

1. A circuit for the temporary interruption of an input sync signal having a plurality of leading edges and a plurality of trailing edges, comprising:
    a first divider that receives said input sync signal and supplies a first signal made up of said sync signal divided by two starting from a leading edge;
    a second divider that receives said inverse input sync signal and supplies a second signal made up of said sync signal divided by two starting from a trailing edge;
    an exclusive OR circuit that receives said first signal and said second signal and that supplies an output sync signal;
    a stop circuit for said first and said second divider;
    an asynchronous command signal of said stop circuit for the temporary interruption of said output sync signal; and
    wherein said first divider and said second divider each comprise a flip flop of the D type; and further wherein when said asynchronous command signal is placed at a low level, each flip flop has its inverse output connected to its input and to an input of said exclusive OR circuit, and when said asynchronous command signal is placed at a high level, each flip flop has a non-inverse output connected to its input and an inverse output connected to an input of said exclusive OR circuit.

2. The circuit of claim 1 wherein said stop circuit comprises a first multiplexer associated with said first divider and a second multiplexer associated with said second divider, each multiplexer having an input connected to the inverse output of said each flip flop of the D type, and an input connected to the non-inverse output of said each flip flop of the D type, and having the output connected to the input of said each flip flop of the D type, and having as a commutation signal said asynchronous command signal.

3. A circuit for the temporary interruption of an input sync signal having a plurality of leading edges and a plurality of trailing edges, comprising:
    a first divider that receives said input sync signal and supplies a first signal made up of said sync signal divided by two starting from a leading edge;
    a second divider that receives said inverse input sync signal and supplies a second signal made up of said sync signal divided by two starting from a trailing edge;
    an exclusive OR circuit that receives said first signal and said second signal and that supplies an output sync signal;
    a stop circuit for said first and said second divider;
    an asynchronous command signal of said stop circuit for the temporary interruption of said output sync signal; and
    wherein said first and second divider each comprise a first flip flop of the D type and a second flip flop of the D type; and further wherein when said asynchronous command signal is placed at a low level, the non-inverse output of said first flip flop of the D type is connected to the input of said second flip flop of the D type and to an input of said exclusive OR circuit, and the inverse output of said second flip flop of the D type is connected to the input of said first flip flop of the D type, and when said asynchronous command signal is placed at a high level, the non-inverse output of said first flip flop of the D type is connected to the input of said first flip flop of the D type, and the non-inverse output of said second flip flop of the D type is connected to the input of said second flip flop of the D type, and to the other input of said exclusive OR circuit.

4. The circuit of claim 3 wherein said stop circuit comprises a first multiplexer having an input connected to the non-inverse output of said first flip flop of the D type, and an input connected to the inverse output of said second flip flop of the D type, and having an output connected to the input of said first flip flop of the D type, and having as a commutation signal said asynchronous command signal, the stop circuit further comprising a second multiplexer having an input connected to the non-inverse output of said first flip flop of the D type, and an input connected to the non-inverse output of said second flip flop of the D type, and having the output connected to the input of said second flip flop of the D type, and having as a commutation signal said asynchronous command signal.

5. A circuit for the temporary interruption of an input sync signal, comprising:
    a first flip flop having a first input for receiving the input sync signal and a first output and a second output;
    a second flip flop having a first input for receiving the input sync signal and a first output and a second output;
    an exclusive OR circuit having first and second inputs coupled to the first outputs of the first and second flip flops, respectively and generating an output sync signal; and
    a control circuit having first and second inputs coupled to the first outputs of the first and second flip flops, respectively, third and fourth inputs coupled to the second outputs of the first and second flip flops, respectively, a control input for receiving a stop signal, and first and second outputs coupled to second inputs of the first and second flip flops.

6. The circuit of claim 5, further comprising reset inputs on the first and second flip flops for receiving a reset signal.

7. The circuit of claim 6 wherein the first flip flop is configured to supply a signal that is made up of the input sync signal divided by two starting from a leading edge.

8. The circuit of claim 6 wherein the second flip flop is configured to supply a signal that is made up of the input sync signal divided by two starting from a trailing edge.

9. The circuit of claim 6 wherein the control circuit comprises first and second multiplexers coupled to the first and second flip flops.

10. The circuit of claim 9 wherein the first multiplexer has an output coupled to the second input of the first flip flop, a first input coupled to the second output of the first flip flop, and a second input coupled to the first output of the first flip flop; and the second multiplexer comprises an output coupled to the second input of the second flip flop, a first input coupled to the second output of the second flip flop, and a second input coupled to the first output of the second flip flop.

11. The circuit of claim 10 wherein the first and second multiplexers each have a control input configured to receive the stop signal.

12. The circuit of claim 11, further comprising an inverter coupled to the input of the second flip flop for inverting the input sync signal prior to reception by the second flip flop.

13. A circuit for the temporary interruption of an input sync signal, the circuit comprising:

a first flip flop having a first input for receiving a control signal and a second input for receiving the input sync signal, and a first output;

a second flip flop having a first input for receiving a second control signal and a second input for receiving an inverse of the input sync signal, and a first output and a second output;

an exclusive OR circuit having a first input coupled to the first output of the first flip flop and a second input coupled to the first output of the second flip flop; and a control circuit having a first input coupled to the output of the first flip flop, a second input coupled to the second output of the second flip flop, a third input coupled to the first output of the second flip flop, and a fourth input configured to receive a stop signal.

14. The circuit of claim 13 wherein the first flip flop has a third input for receiving a reset signal, and the second flip flop has a third input for receiving the reset signal.

15. The circuit of claim 13 wherein the control circuit comprises a first multiplexer having an output coupled to the first input of the first flip flop and a second multiplexer having an output coupled to the first input of the second flip flop, the first multiplexer having a first input coupled to the second output of the second flip flop, a second input coupled to the first output of the first flip flop and to a first input of the second multiplexer, and the second multiplexer having a second input coupled to the first output of the second flip flop.

16. The circuit of claim 15 wherein the first and second multiplexers each have a control input for receiving the stop signal.

17. The circuit of claim 16, further comprising an inverter having an input for receiving the input sync signal and an output coupled to the second input of the second flip flop.

18. A method for temporarily interrupting an input sync signal, comprising:

supplying an input sync signal to a first flip flop and an inverse of the input sync signal to a second flip flop;

providing an output from the first flip flop that is made up of the input sync signal divided by two starting from a leading edge, and providing from the second flip flop an output signal that is made up of the input sync signal inverted divided by two starting from a trailing edge; and supplying a stop signal to a control circuit that in turn sends stop signals to the first and second flip flops that stops their outputs at the state in which they were previously, wherein sending the stop signal to the control circuit comprises sending the stop signal to a first and a second multiplexer that have outputs coupled respectively to the first and second flip flops and have inputs coupled to outputs of the first and second flip flops for receiving output signals from the first and second flip flops.

19. The method of claim 18, further comprising sending the output signal from the first flip flop to a first input of a logic circuit and sending the output signal from the second flip flop to the logic circuit.

20. The method of claim 19, wherein the logic circuit is an exclusive OR circuit.

\* \* \* \* \*